(12) United States Patent
Huang et al.

(10) Patent No.: US 8,624,617 B2
(45) Date of Patent: Jan. 7, 2014

(54) TEST PROBE

(75) Inventors: Mao-Sheng Huang, Tu-Cheng (TW); Chuang Yue, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 437 days.

(21) Appl. No.: 13/163,750

(22) Filed: Jun. 20, 2011

(65) Prior Publication Data

US 2012/0126842 A1 May 24, 2012

(30) Foreign Application Priority Data

Nov. 24, 2010 (CN) .......................... 2010 1 0557466

(51) Int. Cl.
*G01R 31/00* (2006.01)
(52) U.S. Cl.
USPC ................. 324/755.11; 324/755.02; 324/149

(58) Field of Classification Search
USPC .............................................. 324/149, 755.02
See application file for complete search history.

(56) References Cited

U.S. PATENT DOCUMENTS

| 4,491,788 A | * | 1/1985 | Zandonatti | .................... 324/72.5 |
| 4,716,365 A | * | 12/1987 | Pool | ......................... 324/754.14 |
| 5,041,781 A | * | 8/1991 | Kawada et al. | ........... 324/755.11 |

* cited by examiner

*Primary Examiner* — Minh N Tang
(74) *Attorney, Agent, or Firm* — Altis Law Group, Inc.

(57) ABSTRACT

A test probe for testing an object electrically includes a main body, a first probe pin mounted to and protruding out of the main body, and at least one second probe pin coupled to the main body. The at least one second probe pin is changeable from a first state of being folded into the main body to a second state of being unfolded to protrude out of the main body. When the at least one second probe pin is in the first state, the first probe pin is used to contact the object, and when the at least one second probe pin is in the second state, the at least one second probe pin takes the place of the first probe pin in making electrical connection with the object.

20 Claims, 5 Drawing Sheets

TEST PROBE

BACKGROUND

1. Technical Field

The present disclosure relates to test probes.

2. Description of Related Art

A typical test probe for testing resistance, for example in semiconductor circuits, often includes a probe pin for making electrical contact with the object. However, the probe pin is generally made of hard metal, such as tungsten or its alloys, and is always tined. Thus, the surface of some objects (for example the copper coated pathways on PCBs) may very easily be scraped by the tined end of the probe pin.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the five views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
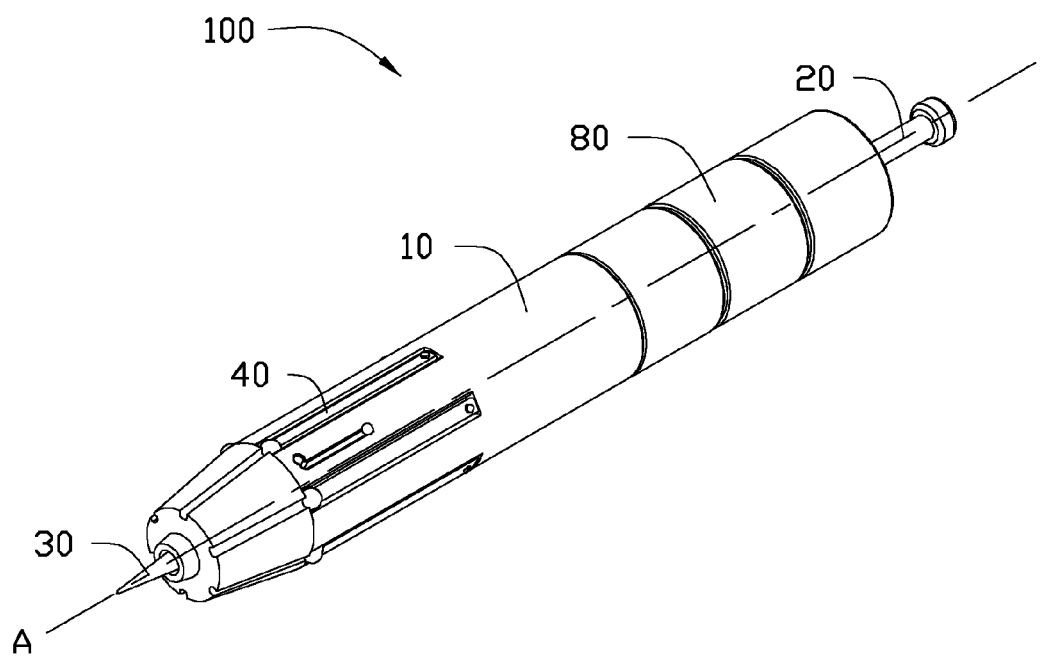
FIG. 1 is a perspective view of a test probe in accordance with an embodiment; the test probe is be used in a first state.

Referring to FIG. 1, a test probe 100 in accordance with an embodiment is shown. The test probe 100 includes a main body 10, a conductive post 20 mounted to the main body 10, a first probe pin 30 mounted to an end of the conductive post 20 and protruding out of the main body 10, and a number of second probe pins 40 electrically connected to the conductive post 20. The second probe pin 40 are rotatably coupled to the main body 10, are arranged circumferentially around the main body 10, and are capable of being rotated outwards approximately one hundred and eighty degrees from a first position within the main body 10 to a second extended or protruded position out of the main body 10. The manner of operation of each of the second probe pins 40 is similar to that of a flick-knife. In the embodiment, the conductive post 20, the first probe pin 30 and the second probe pins 40 are conductors, and are made of conductive metal such as copper.

Figure 2:
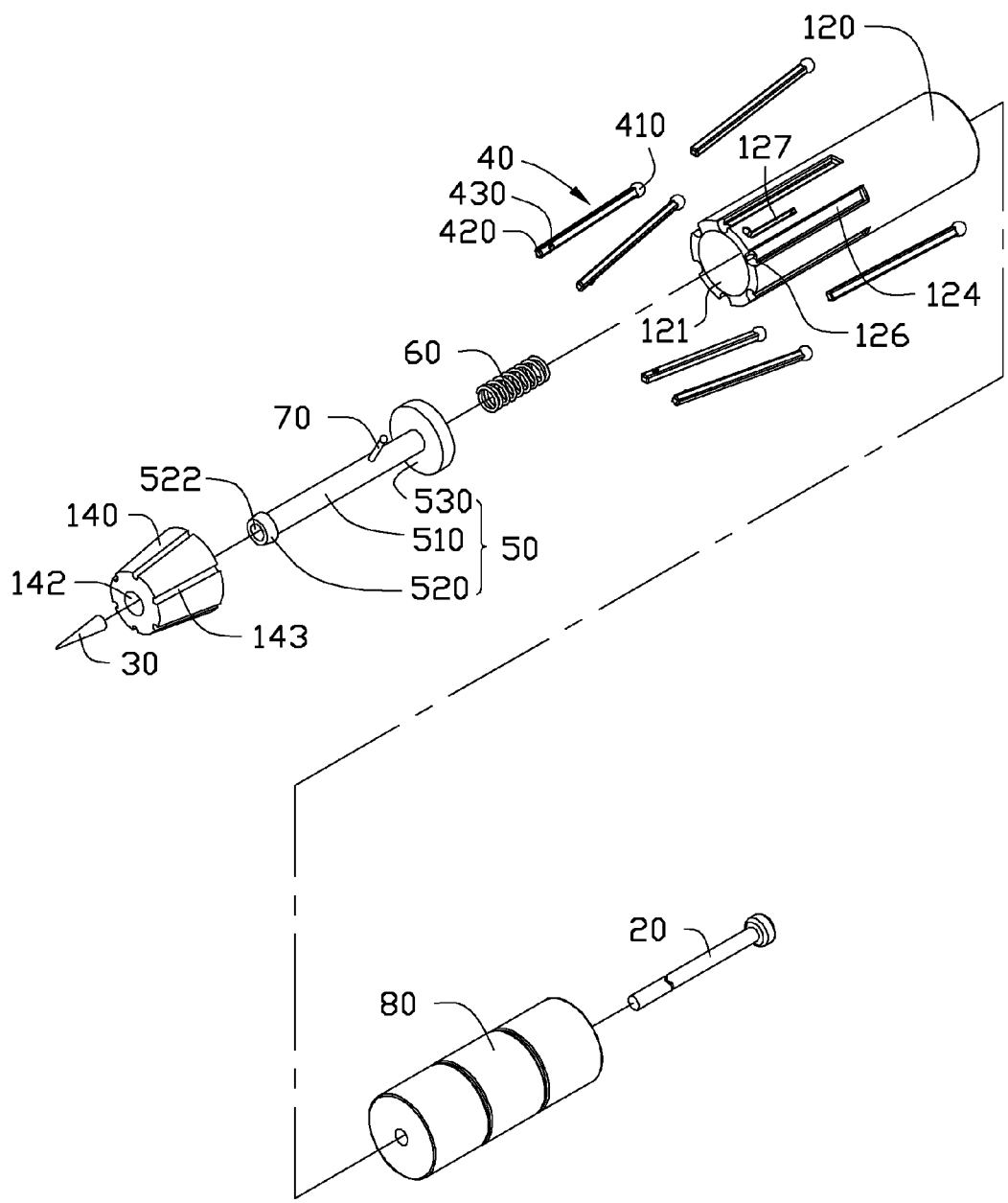
FIG. 2 is a disassembled perspective view of the test probe of FIG. 1.
Figure 3:
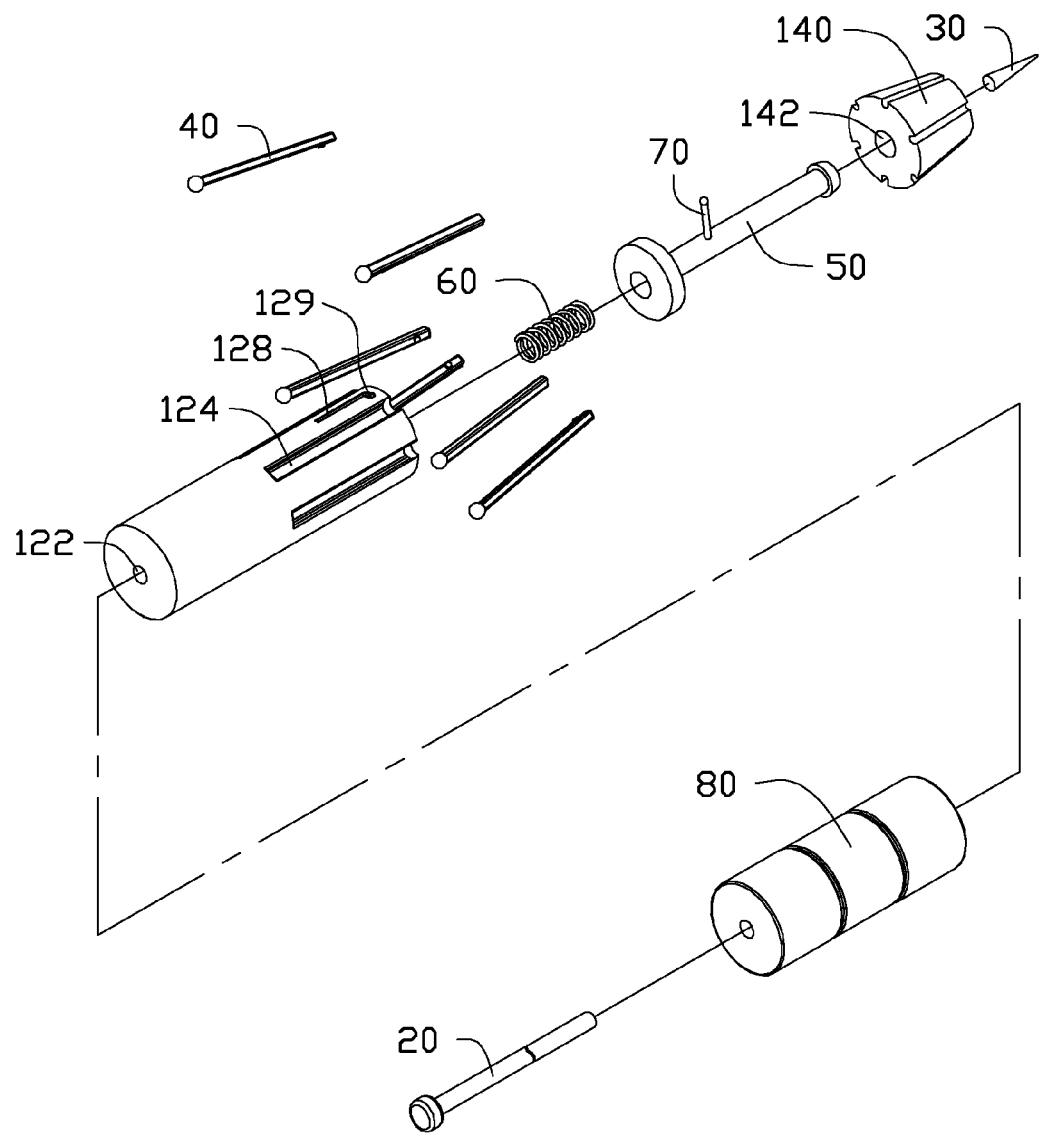
FIG. 3 is similar to FIG. 2, but viewed from another aspect.

Referring to FIGS. 2-3, the main body 10 includes a cylindrical portion 120 and a head portion 140 mounted to the cylindrical portion 120. The cylindrical portion 120 is hollow and has an axis A (see FIG. 1). An end of the cylindrical portion 120 adjacent to the head portion 140 recesses to define a receiving space 121 extending along the axis A, and the other end of the cylindrical portion 120 defines a fixing hole 122 extending along the axis A and communicating with receiving space 121. The fixing hole 122 is used to mount the conductive post 20 thereinto. The outer surface of the cylindrical portion 120 defines a number of receiving slots 124 extending in a direction parallel to the axis A. The receiving slots 124 are arranged evenly at the end of the cylindrical portion 120 adjacent to the head portion 140, and are used for receiving and containing the second probe pins 40 respectively. An end of each receiving slot 124 adjacent to the head portion 140 includes a receiving portion 126. The receiving portions 126 are substantially spherical in cross section. One end of each second probe pin 40 is rotatably received in a corresponding receiving portion 126, such that the second probe pins 40 are rotatably coupled to the main body 110.

The cylindrical portion 120 further defines a guiding slot 127. The guiding slot 127 is substantially L-shaped and is arranged radially in the main body 10 between two adjacent receiving slots 124. The guiding slot 127 includes a guiding portion 128 parallel to the axis A and a limiting portion 129 communicating with the guiding portion 128. The limiting portion 129 extends in a direction perpendicular to the axis A.

The head portion 140 is substantially in the shape of a frustum in the embodiment, and is coaxial with the cylindrical portion 120. The head portion 140 is mounted to an end of the cylindrical portion 120 defining the receiving space 121. The head portion 140 defines a guiding hole 142 along the axis A. The diameter of the guiding hole 142 is larger than that of the conductive post 20, but is less than that of the receiving space 121. The head portion 140 defines a number of latching slots 143 respectively corresponding to the receiving slots 124. The latching slots 143 are arranged evenly at the outer surface of the head portion 140, and are used to limit the movement of the second probe pins 40 when the second probe pins 40 rotate outwards to the second position.

The conductive post 20 is cylindrical and is fixed coaxially to the main body 10 by means of the fixing hole 122. A portion of the conductive post 20 is received in the main body 10. An end of the conductive post 20 is received in the guiding hole 142 and is substantially coplanar with the end of the head portion 140 farthest from the cylindrical portion 120, and the other end of the conductive post 20 protrudes out of the cylindrical portion 120.

The tine of the first probe pin 30 is substantially conical. An end of the first probe pin 30 is mounted coaxially to the end of the conductive post 20 received in the guiding hole 142, and the other end of the first probe pin 30 protrudes from the head portion 140. The extension of the first probe pin 30 from the end of the conductive post 20 is integral in this embodiment.

The second probe pins 40 are electrically connected to the conductive post 20. The length of the second probe pins 40 when protruding out of the main body 10 is less than that of the first probe pin 30 protruding out of the main body 10. Each second probe pin 40 includes a rotating portion 410 and an end portion 420 opposite to the rotating portion 410. The rotating portion 410 is substantially spherical, and is rotatably received in the corresponding receiving portion 126 of the receiving slots 124. The end portion 420 is blunt, and is used to make contact with the object to be tested (as shown in FIG. 2). A magnetic member 430 is arranged at an end of each second probe pin 40 adjacent to the end portion 420.

The test probe 100 further includes a sliding member 50, an elastic element 60, and an operating member 70. The sliding member 50 is slidably received in the main body 10. The elastic element 60 is received in receiving space 121 and resists the sliding member 50 to provide an elastic force between the sliding member 50 and the cylindrical portion 120 when pressed by the sliding member 50. The operating member 70 is fixed to the sliding member 50 and is slidably received in the guiding slot 127. The operating member 70 is used to drive the sliding member 50 to slide relative to the main body 10.

Referring to FIG. 2 again, the sliding member 50 includes a sleeve 510, a first magnet 520, and a second magnet 530. The sleeve 510 is hollow and may slide along the conductive post 20. The first magnet 520 is substantially in the shape of a frustum in the embodiment, and defines a round hole 522 extending along an axis thereof. The first magnet 520 sleeves on an end of the sleeve 510 via the round hole 522. The second magnet 530 is substantially in the shape of a disk, and sleeves on an end of the sleeve 510 opposite to the first magnet 520. The diameter of the first magnet 520 is larger than that of the guiding hole 142. The diameter of the second magnet 530 is larger than that of the guiding hole 142, but is less that that of the receiving space 121.

Furthermore, the test probe 100 includes a plurality of weights 80. The weights 80 are substantially cylindrical and are made of insulation material or covered with insulation material. Each weight 80 defines a hole 810 extending in an axis thereof. The hole 810 is used to receive the conductive post 20, whereby the weights 80 sleeve on the conductive post 20.

In assembly, the conductive post 20 is fixed to the cylindrical portion 120. The elastic element 60, the second magnet 530 and the sleeve 510 are sleeved on the conductive post 20 in order and are further received in the receiving space 121. The rotating portions 410 are received in the corresponding receiving portion 126, and the head portion 140 is mounted to the cylindrical portion 120, thus, the second probe pins 40 are rotatably coupled to the main body 10. The first probe pin 30 is mounted to the conductive post 20. The first magnet 520 sleeves on an end of the sleeve 510 opposite to the second magnet 530. Finally, the operating member 70 extends through the guiding slot 124 and is mounted to the sleeve 510.

Referring to FIG. 1 again, the test probe 100 in a first state is shown. In the first state, the second probe pins 40 are folded and are resting in their corresponding receiving slots 124, the operating member 70 is at an end of the sliding portion 128 opposite to the limiting portion 129 of the guiding slot 127, and the sliding member 50 is in the main body 10 with the first magnet 520 resisting against the head portion 140 and the second magnet 520 at an end of the receiving space 121 away from the head portion 140. The attractive force of the second magnet 530 on the magnetic members 430 causes the second probe pins 40 to remain retracted in the receiving slots 124, and the first probe pin 30 protruding out of the main body 10 is capable of being used to test an object. In the first state, the elastic element 60 may be in an original state.

Figure 4:
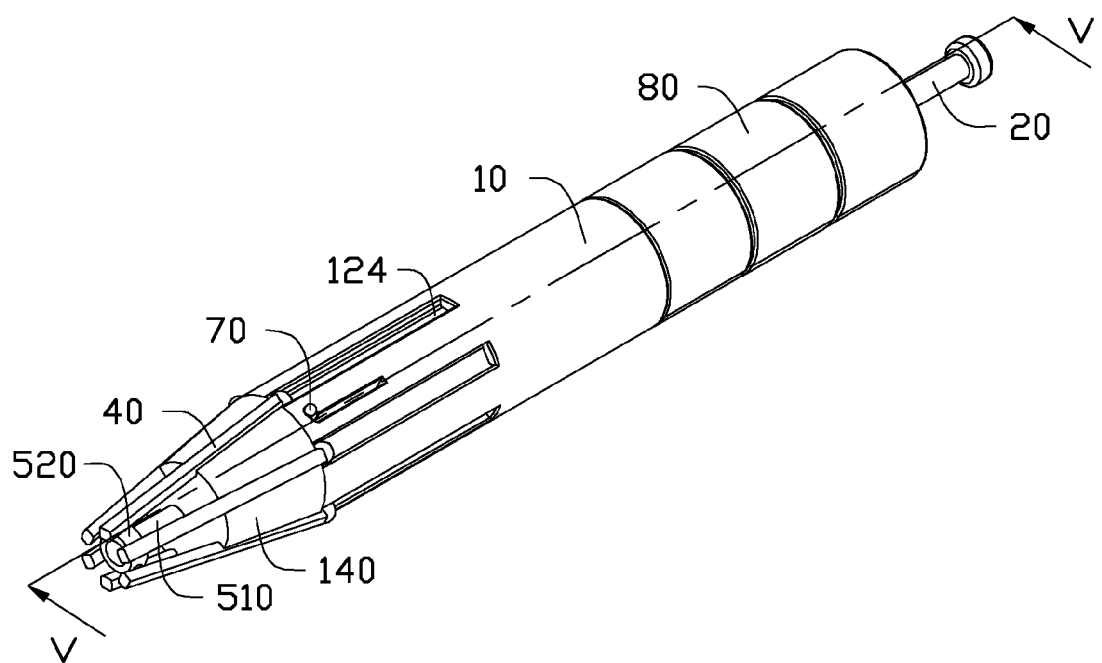
FIG. 4 is a perspective view showing the test probe of FIG. 1 being used in a second state.
Figure 5:
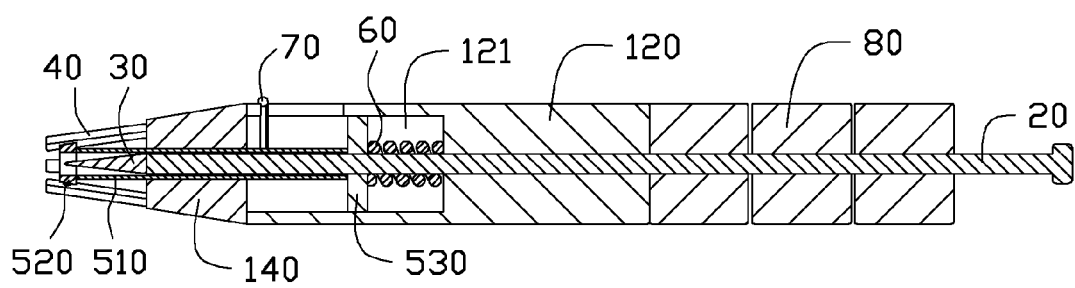
FIG. 5 is a cross-sectional view taken along line V-V of FIG. 4.

Referring to FIGS. 4-5, the test probe 100 in a second state is shown. In the second state, the operating member 70 slides to the limit imposed by the limiting portion 129 (as shown in FIG. 3), the sliding member 50 slides toward the first probe pin 30 with the first magnet 520 sliding away from the head portion 140 and covering the first probe pin 30, the second magnet 530 slides to a position adjacent to the head portion 140, and the elastic element 60 is stretched by the sliding member 50. The movement of the second magnet 530 to a position adjacent to the head portion 140 decreases the force of magnetic attraction between the second magnet 530 and the magnetic members 430. Thus, if the first probe pin 30 is pointing vertically downwards, the second probe pins 40 may be driven by gravity to rotate approximately one hundred and eighty degrees outwards towards the head portion 140 and be received in the limiting slots 143, and the second probe pins 40, experiencing the magnetic force of the first magnet 520, may then remain in place. Therefore, the second probe pins 40 having blunt ends can substitute for the first probe pin 30 in making electrical contact with the object to be tested, thereby protecting the object from scrape-damage caused by the first probe pin 30.

By virtue of the test probe 100, the second probe pins 40, of various materials, types, and profiles, are individually selectable in substituting for the first probe pin 30.

It is to be understood, even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. A test probe for testing an object, comprising:
a main body;
a first probe pin mounted to and protruding out of the main body; and
at least one second probe pin rotatably coupled to the main body, the at least one second probe pin being changeable from a first state being folded to a second state being unfolded to protrude out of the main body;
wherein when the at least one second probe pin is changed to the first state, the first probe pin is used to contact the object, and when the at least one second probe pin is changed to the second state, the at least one second probe pin is used to contact the object.

2. The test probe of claim 1, wherein the main body comprises a cylindrical portion defining at least one receiving slot and a head portion mounted coaxially to the cylindrical portion, and the head portion defines at least one limiting slot corresponding to the at least one receiving slot.

3. The test probe of claim 2, wherein the at least one second probe pin is resting in the at least one receiving slot when being in the first state, and is limited to the at least limiting slot and protrudes out of the main body when being in the second state.

4. The test probe of claim 3, wherein the length of the first probe pin protruding out of the main body is less than the length of the at least one second probe pin protruding out of the main body.

5. The test probe of claim 2, wherein the at least one receiving slot comprises a receiving portion for rotatably receiving an end of the at least one second probe pin, and the receiving portion is arranged at an end of the at least one receiving slot adjacent to the head portion.

6. The test probe of claim 1, further comprising a conductive post mounted to the main body, the first probe pin electrically mounted to an end of the conductive post and protruding out of the main body, the at least one second probe pin electrically connected to the conductive post.

7. The test probe of claim 6, further comprising a sliding member slidably received in the main body and slidably sleeved on the conductive post, the sliding member capable of sliding out of the main body to hide the first probe pin and sliding into the main body to expose the first probe pin.

8. The test probe of claim 7, wherein the sliding member comprises a first magnet and a second magnet, the first magnet and the second magnet are arranged at opposite ends of the sliding member, the first magnet is arranged out of the main body and is used to attract the at least one second probe pin when the at least one second probe pin is in the second state; and the second magnet is slidalby received in the main body and is used to attract the at least one second probe pin when the at least one second probe pin is in the first state.

9. The test probe of claim 8, further comprising an operating member, the operating member being mounted to the sliding member and used to drive the sliding member sliding relatively the main body.

10. The test probe of claim 8, further comprising an elastic element connecting the sliding member to the main body.

11. The test probe of claim 6, wherein a portion of the conductive post protrudes out of an end of the main body opposite to first probe pin.

12. The test probe of claim 10, further comprising a plurality of weights, the weights sleeving on the portion of the conductive post protruding out of the main body.

13. A test probe capable of being used in a first state and a second state, comprising:
   a main body;
   a first probe pin mounted to and protruding out of the main body; and
   at least one second probe pin rotatably coupled to the main body, the at least one second probe pin capable of rotating from a first position being received in the main body to a second position protruding out of the main body;
   wherein when the at least one second probe pin rotates to the first position, the first probe pin is exposed and is used to contact an object, and the test probe is used in the first state; and when the at least one second probe pin rotates to the second position, the at least one second probe pin hides the first probe pin and is used to contact the object, and the test probe is used in the second state.

14. The test probe of claim 13, wherein the main body comprises a cylindrical portion defining at least one receiving slot and a head portion mounted coaxially to the cylindrical portion and defining at least one limiting slot corresponding to the at least one receiving slot.

15. The test probe of claim 14, wherein the at least one second probe pin is received in the at least one receiving slot when being in the first position, and is limited to the at least limiting slot and protrudes out of the main body when being in the second position.

16. The test probe of claim 15, wherein the length of the first probe pin protruding out of the main body is less than the length of the at least one second probe pin protruding out of the main body.

17. The test probe of claim 13, further comprising a conductive post mounted to the main body, the first probe pin electrically mounted to an end of the conductive post and protruding out of the main body, the second probe pin electrically connected to the main body.

18. The test probe of claim 17, further comprising a sliding member slidably received in the main body and slidably sleeve on the conductive post, the sliding member capable of sliding out of the main body to hide the first probe pin and sliding into the main body to expose the first probe pin.

19. The test probe of claim 18, wherein the sliding member comprises a first magnet and a second magnet, the first magnet and the second magnet are arranged at opposite ends of the sliding member, the first magnet is arranged out of the main body and is used to attract the at least one second probe pin when the at least one second probe pin is in the second state; the second magnet is slidalby received in the main body and is used to attract the at least one second probe pin when the at least one second probe pin is in the first state.

20. The test probe of claim 17, further comprising a plurality of weights, the weights sleeved on the conductive post protruding out of the main body.

* * * * *